United States Patent [19]
Wang

[11] Patent Number: 6,018,477
[45] Date of Patent: Jan. 25, 2000

[54] INTELLIGENT REFRESHING METHOD AND APPARATUS FOR INCREASING MULTI-LEVEL NON-VOLATILE MEMORY CHARGE RETENTION RELIABILITY

[75] Inventor: Hai Wang, Fremont, Calif.

[73] Assignee: Information Storage Devices, Inc., San Jose, Calif.

[21] Appl. No.: 09/169,037

[22] Filed: Oct. 8, 1998

[51] Int. Cl.[7] .................................................. G11C 16/06
[52] U.S. Cl. ................................ 365/185.25; 365/185.03; 365/185.21
[58] Field of Search ......................... 365/185.03, 185.25, 365/185.21, 222

[56] References Cited

U.S. PATENT DOCUMENTS 5,594,691  1/1997  Bashir ............................. 365/185.21
5,894,436  4/1999  Ohkawa et al. ................... 365/185.03

*Primary Examiner*—Huan Hoang
*Attorney, Agent, or Firm*—Blakely, Sokoloff, Taylor & Zafman LLP

[57] ABSTRACT

An intelligent refreshing method and apparatus for increasing multi-level non-volatile memory charge retention reliability is described. In one embodiment, the apparatus comprises a circuit that is coupled to a multi-level memory cell and a sensing circuit. The sensing circuit senses a voltage of the memory cell and provides a digital value in response thereto. The circuit includes a selection circuit that receives the digital value and at least one trigger voltage, and provides an output trigger voltage responsive to the digital value. The circuit further includes a comparator having a first terminal coupled to receive the output trigger voltage, a second terminal coupled to receive the memory cell voltage, and an output terminal.

26 Claims, 2 Drawing Sheets

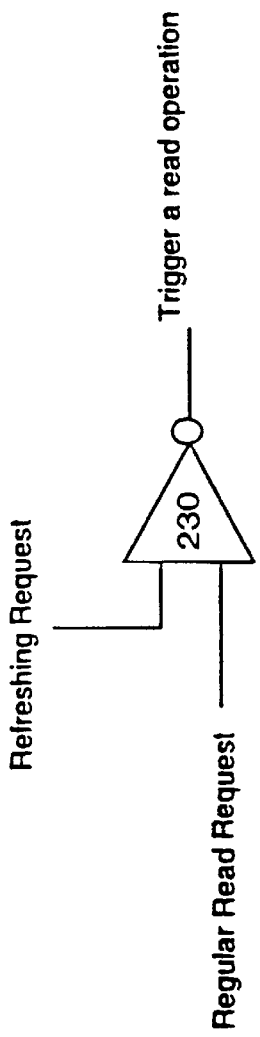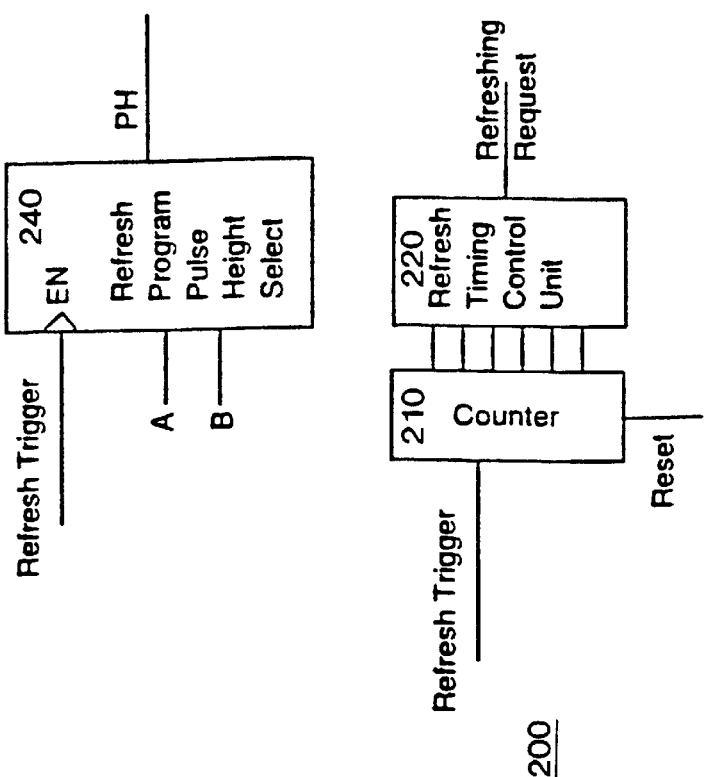
FIG. 2B
FIG. 2C
FIG. 2A 200

INTELLIGENT REFRESHING METHOD AND APPARATUS FOR INCREASING MULTI-LEVEL NON-VOLATILE MEMORY CHARGE RETENTION RELIABILITY

BACKGROUND OF THE INVENTION

1. Field of the Invention

The present invention related generally to the field of non-volatile memory devices, and specifically, to a method and apparatus for increasing the charge retention reliability of such memory devices.

2. Background Information

The advancement of silicon technology calls for aggressive shrinking of a non-volatile memory cell size, especially for electrically erasable programmable read only memory ("EEPROM") devices. There are generally two approaches to shrink the cell size. The first approach is to shrink the physical size of the cell both in the vertical and horizontal dimensions. The second approach is to increase the information density stored in a single cell. For example, to increase the information density of a cell n times, $2^n$ distinguishable levels in a single cell are required. Instead of one bit per cell, this multi-level approach stores n bit per cell.

The trade-off of such aggressive scaling is the lowering of cell operating reliability due to undesirable floating gate charge loss. While physical scaling results in more charge loss because of its thinner dielectric layer around the floating gate, the multi-level cell operation reduces cell reliability by decreasing the tolerance of the charge loss, since the normal dynamic range is now divided into $2^n$ distinguishable levels. The more discrete levels a cell is divided into, the narrower the error margin of each level becomes.

One obvious technique to combat the charge loss is to improve process technologies and increase the integrity of insulator layers around the floating gate. However, unless there is a revolutionary technological breakthrough, the data retention characteristics of the cells are unlikely to be improved significantly for a given technology. Since multi-level cell operation puts an extra burden on the charge loss requirement, cell data retention characteristics have emerged as a bottleneck for the multi-level flash technology.

Other techniques used to increase cell data retention margins include increasing the cell operating range by raising the operating voltage and utilizing error correction circuits in a product to detect and correct errors during operation. The drawbacks to the former technique include the increase in chip power consumption and the introduction of serious constrains to device (cell) scaling due to high voltage operation requirements. It may even trigger another charge loss mechanism, namely, read disturb, which will further enhance the total charge loss phenomenon. The disadvantages of the latter technique include longer propagation delays and significant increase in the memory array overhead, or the non-essential memory part of the circuit. This in turn increases the cost of the chip, making device scaling or multi-level cells much less attractive from an economic point of view.

SUMMARY OF THE INVENTION

The present invention is a method and apparatus for increasing non-volatile memory cell charge retention reliability. In one embodiment, the apparatus comprises a circuit that is coupled to a multi-level memory cell and a sensing circuit. The sensing circuit senses a voltage of the memory cell and provides a digital value in response thereto. The circuit includes a selection circuit that receives the digital value and at least one trigger voltage, and provides an output trigger voltage responsive to the digital value. The circuit further includes a comparator having a first terminal coupled to receive the output trigger voltage, a second terminal coupled to receive the memory cell voltage, and an output terminal.

BRIEF DESCRIPTION OF THE DRAWINGS

FIG. 2A illustrates a refresh timing control circuit, in accordance to one embodiment of the present invention.

FIG. 2B illustrates a circuit for triggering a refresh operation, according to one embodiment of the present invention.

FIG. 2C illustrate a refresh program pulse control circuit, according to one embodiment of the present invention.

DETAILED DESCRIPTION

Figure 1:
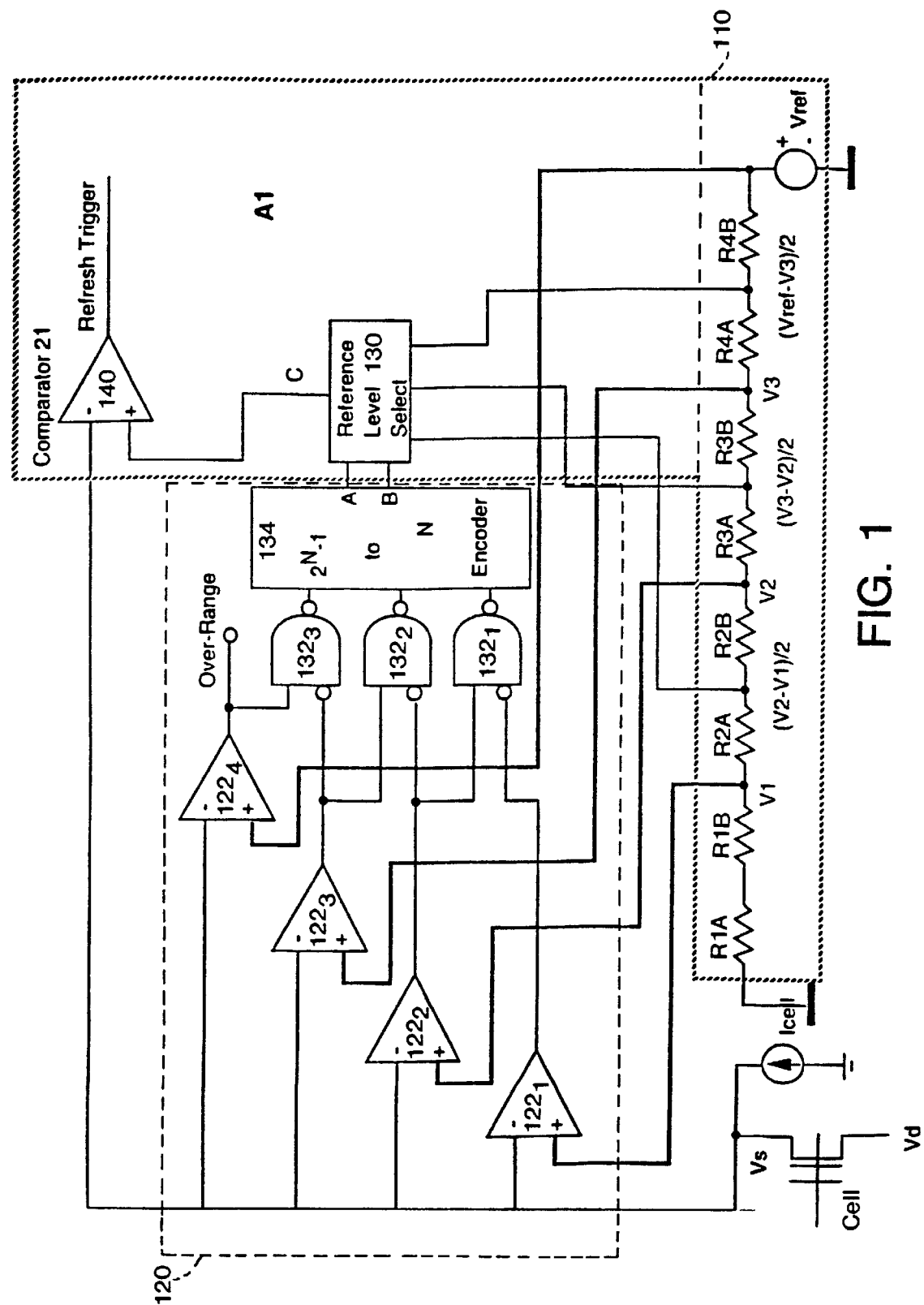
FIG. 1 illustrates a refresh circuit, according to one embodiment of the present invention.

In one embodiment, the present invention is a method and apparatus for increasing non-volatile memory cell charge retention reliability by intelligently refreshing degraded non-volatile memory cells before such cells lose sufficient charge to cause errors. Moreover, the present invention prevents programming of memory cells that do not need to be refreshed. This saves power and slows the aging of the memory array, which are the two big factors that prevent refresh techniques from being utilized in Flash technology. The present invention further provides flexible refreshing periods to compensate for variations associated with process, design, cell layout, and operating environment.

In the following description, for purposes of explanation, numerous details are set forth in order to provide a thorough understanding of the present invention. However, it will be apparent to one skilled in the art that these specific details are not required in order to practice the present invention.

FIG. 1 illustrates a refresh circuit 100, according to one embodiment of the present invention. For sake of clarity and illustration of the present invention, the refresh circuit 100 supports a memory cell that stores up four discrete voltage levels. However, it is contemplated that the refresh circuit may support a memory cell having any number of discrete levels. For example, the present invention may be utilized with conventional two-level memory cells or memory cells having 256 discrete levels or better.

Referring to FIG. 1, the refresh circuit 100 includes a reference and trigger voltage generator circuit 110, a sensing circuit 120, a select circuit 130, and a comparator circuit 140. The reference and trigger voltage generator circuit 110 includes a plurality of resistor pairs R1A–R1B, R2A–R2B, R3A–R3B, and R4A–R4B which are connected in series between a power supply terminal having a reference voltage (Vref) thereon and circuit ground terminal (GND). In addition to the reference voltage Vref, the reference and trigger voltage generator circuit 110 provides intermediate reference voltages V1, V2, and V3. The number of reference voltages provided by the circuit 100 (four in this case) corresponds to the number of discrete voltage levels supported by the memory cells. Each reference voltage represents a boundary between two discrete voltage levels supported by the memory cells.

It is to be noted that although the reference and trigger voltage generator circuit 110 comprises series resistors, other types of reference circuits may be used in lieu thereof. Moreover, for more complicated triggering algorithms, there can also be multiple reference boundaries (levels) between two discrete cell voltage levels.

Resistor pair R1A–R1B is placed in series between GND and V1, resistor pair R2A–R2B is placed in series between V2 and V2, resistor pair R3A–R3B is placed in series between V2 and V3, and resistor pair R4A–R4B is placed in series between V3 and Vref. In one embodiment, the resistance value of each resistor pair (e.g., R1A+R1B, R2A+R2B, R3A+R3B, and R4A+R4B) is equal such that the voltage difference between the reference voltages Vref, V3, V2, and V1 is equal.

For example, for a four level memory cell with a reference voltage of 4 volts, V1=1 volt, V2=2 volts, and V3=3 volts. Thus, a memory cell voltage of (i) 0 to 1 volt represents a first contiguous voltage range band and corresponds to a first discrete level; (ii) 1 to 2 volts represents a second contiguous voltage range band and corresponds to a second discrete level, (iii) 2 to 3 volts represents a third contiguous voltage range band and corresponds to a third discrete level, and (iv) 3 to 4 volts represents a fourth contiguous voltage range band and corresponds to a fourth discrete level. It is contemplated that the resistance value of one resistor pair may be different from the resistance value of another resistor pair, e.g., the voltage difference between Vref, V3, V2, and V1 may be different.

In addition, the reference and trigger voltage generator circuit 110 further provides a plurality of triggering voltages VT1, VT2, and VT3. The voltage of VT3 is (Vref–V3)(R4A/R4A+R4B), VT2 is (V3–V2)(R3A/R3A+R3B), and VT1 is (V2–V1)(R2A/R2A+R2B). In one embodiment, each resistor in a resistor pair is equal in value (e.g., R4A=R4B) such that each triggering voltage is at a voltage exactly in between adjacent reference voltages. That is, VT3=(Vref–V3)/2, VT2=(V3–V2)/2, and VT1=(V2–V1)/2. However, each resistor in a resistor pair may have a different resistance value, in which case the corresponding triggering voltage will be at some voltage within adjacent reference voltages, but not exactly in between adjacent reference voltages. Thus, if R4A=2*R4B, then VT3=(Vref–V3)(2/3).

The sensing circuit 120 includes a plurality of comparators $122_1$–$122_4$, where the number of comparators corresponds to the number of discrete voltage levels supported by the memory cells. The plurality of comparators $122_1$–$122_4$ are coupled to a selected memory cell C1 in an array of memory cells. In particular, the selected memory cell C1 is coupled to a first terminal (e.g., inverting terminal) of each comparator $122_1$–$122_4$ and the reference voltages are coupled to a second terminal (e.g., non-inverting terminal) of corresponding comparators. Thus, the plurality of comparators $122_1$–$122_4$ compare the reference voltages with the actual output voltage of the selected memory cell C1, which is configured in a source follower mode.

The output of the comparators $122_1$–$122_4$ are coupled to NAND gates $132_1$–$132_3$. More specifically, the output of comparator $122_4$ is coupled to an input of NAND gate $132_3$, the output of comparator 1223 is inverted and coupled to a second input of NAND gate $132_3$, and is coupled to an input of NAND gate $132_2$, the output of comparator $122_2$ is inverted and coupled to a second input of NAND gate $132_2$, and is coupled to an input of NAND gate $132_1$, and the output of comparator $122_1$ is inverted and coupled to a second input of NAND gate $132_1$.

The outputs of the NAND gates are coupled to an encoder 134 which receives 2N–1 inputs and provides N outputs. The N outputs correspond to the digital representation of the output voltage level stored in the selected memory cell. For example, if the output voltage level of the selected memory cell C1 is between V1 and V2, then N is 01. The outputs of the encoder 134 are coupled to a selector 130. The triggering voltages VT1, VT2, and VT3 are coupled to the input of the selector 130 with the outputs of the encoder 134 selecting the triggering voltage to be applied on the output of the selector 130. It must be noted that the selector 130 may be implemented a number of different ways such as, for example, by way of a multiplexer, combinational logic, etc.

The output of the selector 130 is coupled to a first input (e.g., non-inverting terminal) of the comparator 140 with the output of the memory cell coupled to a second input (e.g., inverting terminal) of the comparator. If the output voltage of the memory cell C1 is (equal to or) lower than the selected triggering voltage, the comparator 140 signals for a refresh operation, indicating that the memory cell has lost charge and needs to be refreshed, which causes the memory cell C1 to be programmed to a voltage that is at least equal to or greater than the selected trigger voltage. However, if the voltage of the memory cell is equal to or greater than the selected triggering voltage, no refresh operation is performed. The refresh circuit 100 also serves as a control mechanism during the refresh operation to shut down the programming to a memory cell when the same no longer needs to be refreshed.

Circuit Operation

During a refresh operation, the selected memory cell C1 is configured in a read-back mode, as shown in FIG. 1. The memory cell output is fed to an inverting terminal of the comparators $122_1$–$122_4$ of the sensing circuit 120. The reference voltages are also fed to a non-inverting terminal of the respective comparators. The sensing circuit 120 generates a digital output (outputs A & B) which represents which of the four contiguous voltage range bands the memory cell output voltage falls within. The digital outputs then select the trigger voltage to be applied to the comparator 140 for comparing with the memory cell voltage.

FIG. 2A is a refresh timing control circuit 200, according to one embodiment of the present invention. The refresh timing control circuit 200 includes a counter 210 and a timing control unit 220. For each time the refresh trigger signal is asserted (e.g., a memory cell voltage is below a trigger voltage), the counter 210 is incremented. The counter 210 counts the number of refresh operations that are triggered. The timing control unit 220 reads the counter and adjusts the time period between two refreshing operations accordingly. Generally speaking, the more refresh operations are triggered, the shorter the period of time between refresh requests.

FIG. 2B illustrates a circuit for triggering a refresh operation, according to one embodiment of the present invention. Referring to FIGS. 2A and 2B, the output of the timing and control unit 220 is coupled to a NOR gate 230 with a regular read request signal being coupled to a second input of the NOR gate 230. If either input to the NOR gate is true, a refresh operation is triggered.

If the refresh trigger becomes true in the middle of a normal read operation, the refresh operation will be delayed until the end of the on going read operation. Thus, a refresh operation may be started by a regular read request or by the refresh request signal responsive to the refresh timing and control circuit 200.

FIG. 2C illustrate a refresh program pulse control circuit 240, according to one embodiment of the present invention.

The refresh program pulse control circuit 240 takes decoded outputs A & B as a select control of the program procedure. The starting program pulse height can be selected to shorten the program time. If a regular program procedure is used, this circuit is not necessary.

The present invention improves multi-level memory cell (e.g., EEPROM) reliability by applying an intelligent "refresh" technique to ensure correctness of information stored in a cell while making insignificant changes in cell endurance and product power consumption. The current standard calls for typical 100 years data retention reliability in EEPROM products. This standard is difficult to meet with multi-level cell products. However, with the present invention, this standard can be met reliably, as long as the refreshing period, which is also determined intelligently as a part of the invention to compensate for process and environmental variations, is shorter than the effective cell retention period.

For example, if a cell is refreshed once a day, as long as the cell can hold the information longer than a day, the product can be operated reliably. This means that instead of holding sufficient charge for 100 years on the floating gate, the multi-level cells must only hold sufficient charge for one day before a refresh procedure is triggered. As flash cycling standard approach one million cycles, 3,650 cycles in ten year operation is an insignificant percentage of the total cycling life.

The present invention goes one step further by turning every normal read operation into a refresh screen process. Hence, the memory cells are monitored on a much more frequent basis. This compensates for variations due to process, cell location, and operating environment, making the product even more reliable.

The present invention may be implemented in systems having digital memories, digital multi-level memories, and analog memories. Moreover, in serial mode memories, where data is read sequentially, a single circuit of the present invention is required. However, in parallel mode memories, where data is read/output simultaneously, e.g., 32 memory cells at a time, then 32 circuits of the present invention are utilized.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit coupled to a multi-level memory cell, and a sensing circuit that senses an output voltage of the memory cell and provides a digital value responsive thereto, the circuit comprising:
    a selection circuit coupled to receive the digital value and at least one trigger voltage, and to provide an output trigger voltage responsive to the digital value; and
    a comparator including a first terminal coupled to receive the output trigger voltage, a second terminal coupled to receive the output voltage, and an output terminal, the comparator to assert a trigger voltage on the output terminal for causing the memory cell to be programmed to a voltage at least equal to the output trigger voltage if the output voltage is lower than the output trigger voltage.

2. The circuit of claim 1 wherein the selection circuit selects one of the at least one trigger voltage as the output trigger voltage responsive to the digital value.

3. The circuit of claim 1 wherein the selection circuit is a multiplexer.

4. The circuit of claim 1 wherein the first terminal is an inverting terminal and the second terminal is a non-inverting terminal.

5. The circuit of claim 1 further comprising a first trigger voltage ranging between a first boundary voltage and a second boundary voltage.

6. The circuit of claim 1 further comprising a trigger circuit, the trigger circuit including a first resistor pair connected in series, the first resistor pair including a first terminal having the first boundary voltage thereon, a second terminal having the second boundary voltage thereon, and a common terminal having the first trigger voltage thereon.

7. The circuit of claim 6 further comprising a second trigger voltage ranging between the second boundary voltage and a third boundary voltage.

8. The circuit of claim 7 wherein the trigger circuit includes a second resistor pair connected in series, the second resistor pair including a first terminal having the second boundary voltage thereon, a second terminal having the third boundary voltage thereon, and a common terminal having the second trigger voltage thereon.

9. The circuit of claim 8 further comprising a third trigger voltage ranging between the third boundary voltage and a fourth boundary voltage.

10. The circuit of claim 9 wherein the trigger circuit includes a third resistor pair connected in series, the third resistor pair including a first terminal having the third boundary voltage thereon, a second terminal having a fourth boundary voltage thereon, and a common terminal having the third trigger voltage thereon.

11. A method of refreshing a multi-level memory cell, comprising:
    providing a memory cell having an output voltage within a predetermined voltage range, the predetermined voltage range representing N contiguous voltage range bands having N reference voltages, the highest N−1 contiguous voltage range bands including N−1 respective trigger voltages, each trigger voltage being within a voltage range band between adjacent reference voltages;
    comparing the output voltage of the memory cell with the N reference voltages to provide a digital value;
    selecting one of N−1 trigger voltages as an output trigger voltage responsive to the digital value;
    comparing the output trigger voltage with the memory cell output voltage; and
    programming the memory cell to a voltage at least equal to the output trigger voltage if the output voltage of the memory cell is below the output trigger voltage,
    wherein N is a positive whole number greater than one.

12. The method of claim 11 further comprising terminating programming of the memory cell when the output voltage of the memory cell is at least equal to the output trigger voltage.

13. The method of claim 11 wherein N is equal to four.

14. A circuit for reprogramming a multi-level memory cell, comprising:
    a reference circuit to provide at least first and second boundary voltages and at least a first trigger voltage;
    a sensing circuit to receive the at least first and second boundary voltages and a memory cell output voltage, and provide a digital value responsive thereto;
    a selection circuit coupled to receive the at least first trigger voltage and the digital value, and provide a selected trigger voltage responsive to the digital value; and a comparator including a first terminal coupled to receive the selected trigger voltage, a second terminal coupled to receive the memory cell output voltage, and an output terminal.

15. The circuit of claim 14 wherein the comparator causes the memory cell to be programmed to at least the selected trigger voltage if the memory cell output voltage is lower than the selected trigger voltage.

16. The circuit of claim 14 wherein the selection circuit is a multiplexer.

17. The circuit of claim 14 wherein the first terminal is an inverting terminal and the second terminal is a non-inverting terminal.

18. The circuit of claim 14 wherein the reference circuit comprises a first resistor pair connected in series, the first resistor pair including a first terminal having the first boundary voltage thereon, a second terminal having the second boundary voltage thereon, and a common terminal having the first trigger voltage thereon.

19. The circuit of claim 14 wherein the selection circuit selects one of the at least first trigger voltage as the selected trigger voltage responsive to the digital value.

20. The circuit of claim 14 wherein the reference circuit provides first, second, third, and fourth boundary voltages that are coupled to the sensing circuit, and first, second, and third trigger voltages that are coupled to the selection circuit, the selection circuit selects one of the first, second, and third trigger voltages as the selected trigger voltage responsive to the digital value.

21. The circuit of claim 14 wherein the reference circuit provides N boundary voltages that are coupled to the sensing circuit, and N−1 trigger voltages that are coupled to the selection circuit, the selection circuit selects one of the N−1 trigger voltages as the selected trigger voltage responsive to the digital value, wherein N is greater than 1.

22. A circuit coupled to a multilevel memory cell capable of storing one of ($2^N$) discrete levels, comprising:

a reference circuit to provide ($2^N$) boundary voltages and ($2^N-1$) trigger voltages;

a sensing circuit to receive the ($2^N$) boundary voltages and the memory cell output voltage, and provide N digital bits;

a selection circuit coupled to receive the ($2^N-1$) trigger voltages and the N digital bits, and select one of the ($2^N-1$) trigger voltages as an output trigger voltage responsive to the N digital bits; and a comparator including a first terminal coupled to receive the output trigger voltage, a second terminal coupled to receive the memory cell output voltage, and an output terminal, wherein N is a whole number greater than zero.

23. The circuit of claim 22 wherein the comparator causes the memory cell to be programmed to at least the output trigger voltage if the memory cell output voltage is lower than the output trigger voltage.

24. The circuit of claim 22 wherein the reference circuit comprises ($2^N$) resistor pairs each including first and second resistors, a first resistor pair being coupled between a reference voltage and a first boundary voltage and the ($2^N$)th resistor pair being coupled between a ($2^N-1$)st boundary voltage and a ($2^N$)th boundary voltage, the first trigger voltage being coupled between a common terminal of a second resistor pair, and a ($2^N-1$)st trigger voltage being coupled between a common terminal of a ($2^N$)th resistor pair.

25. The circuit of claim 24 wherein each resistor in the ($2^N$) resistor pairs is equal in value.

26. The circuit of claim 24 wherein the sensing circuit comprises:

($2^N$) comparators each including a first terminal that receives a respective one of the ($2^N$) boundary voltages, a second terminal that receives the memory cell output voltage, and ($2^N$) comparator output terminals;

($2^N-1$) AND gates each including a non-inverting input terminal, an inverting input terminal, and an inverting output terminal, the first comparator output terminal being coupled to the inverting terminal of the first AND gate, the second comparator output terminal being coupled to the non-inverting terminal of the first AND gate and the inverting terminal of the second AND gate, and the ($2^N$) comparator output terminal being coupled to the non-inverting terminal of the ($2^N-1$)st AND gate; and an encoder circuit coupled to receive the ($2^N-1$) AND gate output terminals and provide the N digital bits.

* * * * *